United States Patent [19]

Himmelstein

[11] Patent Number: 4,790,175
[45] Date of Patent: Dec. 13, 1988

[54] METHOD AND APPARATUS FOR CALIBRATING A TRANSDUCER HAVING REAL AND REACTIVE IMPEDANCE

[75] Inventor: Sydney Himmelstein, Barrington Hills, Ill.

[73] Assignee: S. Himmelstein & Company, Hoffman Estates, Ill.

[21] Appl. No.: 752,172

[22] Filed: Jul. 5, 1985

[51] Int. Cl.[4] .................. G01D 18/00; G01L 25/00
[52] U.S. Cl. ...................................... 73/1 R; 73/1 C
[58] Field of Search ............... 73/1 R, 1 B, 1 C, 1 D, 73/862.67; 324/63; 340/501

[56] References Cited

U.S. PATENT DOCUMENTS

| | | | |
|---|---|---|---|
| 2,602,839 | 7/1952 | Ellis | 73/1 R |
| 3,203,223 | 8/1965 | Petrow | 73/1 B |
| 3,209,248 | 9/1965 | Seifert | 324/63 |
| 3,463,934 | 8/1969 | Nobis | 73/1 R |

Primary Examiner—Tom Noland
Attorney, Agent, or Firm—Wood, Dalton, Phillips, Mason & Rowe

[57] ABSTRACT

Method and apparatus for calibrating a transducer having real and reactive impedance, which is excited from an excitation source and which provides an output signal connected by an electrical conductor to a remote load. A preamplifier is provided having a high impedance input and a low impedance output connected to the electrical conductor, and calibration structure is provided for alternatively connecting the transducer output to the preamplifier input for preamplifying the transducer output signal and providing to the remote load a low impedance preamplified output signal or providing a substantially purely resistive calibration signal to the preamplifier input for use in calibrating the transducer. In one embodiment, a remote auxiliary calibration circuit is provided including circuitry for selectively calibrating the auxiliary calibration circuit. In one embodiment, a power supply is provided for powering the preamplifier to provide further improved accuracy and convenience.

19 Claims, 1 Drawing Sheet

METHOD AND APPARATUS FOR CALIBRATING A TRANSDUCER HAVING REAL AND REACTIVE IMPEDANCE

TECHNICAL FIELD

This invention relates to apparatus and methods of calibrating transducers and, in particular, to apparatus and methods for calibrating transducers having both real and reactive impedance.

BACKGROUND ART

One common form of transducer utilized in sensing strains, such as representative of torque developed in a drive shaft, comprises a resistive source impedance strain gage. Such strain gages are well known and have their sensitivity expressed in volts output per volt of excitation so that strain measurements made therewith are extremely accurate and repeatable. Accurate laboratory calibrations of strain gages can be readily transferred to the field regardless of differences in the length and exact nature of the cabling used in the laboratory calibration and in the field installation. The effects of such cables are eliminated by temporarily replacing the transducer at the end of the cable with an electrical calibrator that produces a known voltage output per volt of excitation. Such elimination of the cable effects is readily effected where the calibrator has exactly the same output impedance as the transducer.

In using such a calibrator, the calibrator is adjusted to produce either a preselected percentage or a full scale output reading of the previously calibrated transducer. The system gain is then adjusted to full scale or an appropriate percentage of full scale and the transducer is then substituted for the calibrator.

A problem arises, however, when the source impedance of the transducer is not identical to that of the volt-per-volt calibration standard. Such failure of identity occurs where the transducer is not solely resistive. Such transducers having both resistive and reactive impedances occur, for example, where the resistive strain gage is connected in the circuitry by means of rotary transformers rather than resistive slip rings. While such rotary transformers are highly advantageous in many applications where the strain to be measured occurs on a rotating body, such transformers introduce a reactive component so that the transducer impedance is no longer purely resistive. Notwithstanding such undesirable inclusion of the reactive component, such rotary transformers have been used extensively because of the numerous advantages thereof, including elimination of the slip ring problems, including limited life, bridge balance drift due to shunting ring and brush wear, susceptibility to contaminuation, susceptibility to vibration, etc. Such rotary transformer devices, such as torquemeters, are extremely repeatable and, thus, if it were not for the above discussed disadvantages, would provide an ideal substitute for the slip ring systems of the past.

In addition to the inclusion of the reactive impedance in the rotary transformer torquemeters, it is common to utilize temperature compensation networks which cause a variation in the output impedance between different production devices. As a result of these factors, changes in the cable length or cable configuration cause the complex ratio of the transducer output to that of the associated passive calibration networks to vary at the load end of the cable. Thus, even though such systems are extremely repeatable for a given transducer/cable combination, each such combination must be calibrated accurately in order to provide desired high measurement accuracy in the use thereof. Thus if the transducer is replaced, or the cable is replaced or modified, calibration validity is compromised and recalibration thereof must be effected.

DISCLOSURE OF INVENTION

The present invention comprehends an improved apparatus and method for calibrating a transducer having both real and reactive impedance components which is excited from an excitation source and which provides an output signal at a transducer output connected by electrical conductor means to a remote load.

Thus, the invention comprehends an improved apparatus and method for calibrating transducers, such as rotary transformer torquemeter transducers, to maintain high accuracy notwithstanding changes in the length, resistance, capacitance, and inductance of the cabling used during calibration and in the field installation.

The invention comprehends such an apparatus and method which permits calibration without the use of rotating electrical switches or electronic devices.

The invention permits the use of moisture-resistant coatings covering the strain gage circuitry to prevent gage circuit contamination.

The invention permits calibration of the circuitry without physical disassembly of the transducer and without the necessity for transferring the transducer from the installed field location.

The invention comprehends the provision of means permitting use of a conventional shoal calibration network provided within a remote strain cage carrier amplifier.

The invention comprends the arrangement of such a shunt calibration network which may be corrected by referencing to the primary calibration when desired.

More specifically, the invention comprehends the method of calibrating a transducer having a real and reactive impedance which is excited from an excitation source and which provides an output signal at a transducer output connected by electrical conductor means to a remote load, the method of calibrating including the steps of providing a preamplifier having a high impedance input and a low impedance output connected to the electrical conductor means, and alternatively (a) connecting the transducer output to the preamplifier input for preamplifying the transducer output signal and providing through the conductor means to the remote output a low impedance preamplified output signal, and (b) providing a substantially purely resistive calibration signal to the preamplifier input for use in calibrating the transducer.

In the illustrated embodiment, the method comprehends the further steps of providing a conventional auxiliary shunt calibration circuit and selectively causing the calibration circuit to calibrate the auxiliary calibration signal.

In the illustrated embodiment, the method further comprehends the step of providing a power supply for powering the preamplifier.

Still further, the invention comprehends the provision of apparatus for carrying out the novel method of the invention.

The method and apparatus for calibrating a transducer having real and reactive impedance of the invention is extremely simple and economical, while yet providing the highly desirable features discussed above.

BRIEF DESCRIPTION OF THE DRAWING

Other features and advantages of the invention will be apparent from the following description taken in connection with the accompanying drawing wherein.

BEST MODE FOR CARRYING OUT THE INVENTION

Figure 1:
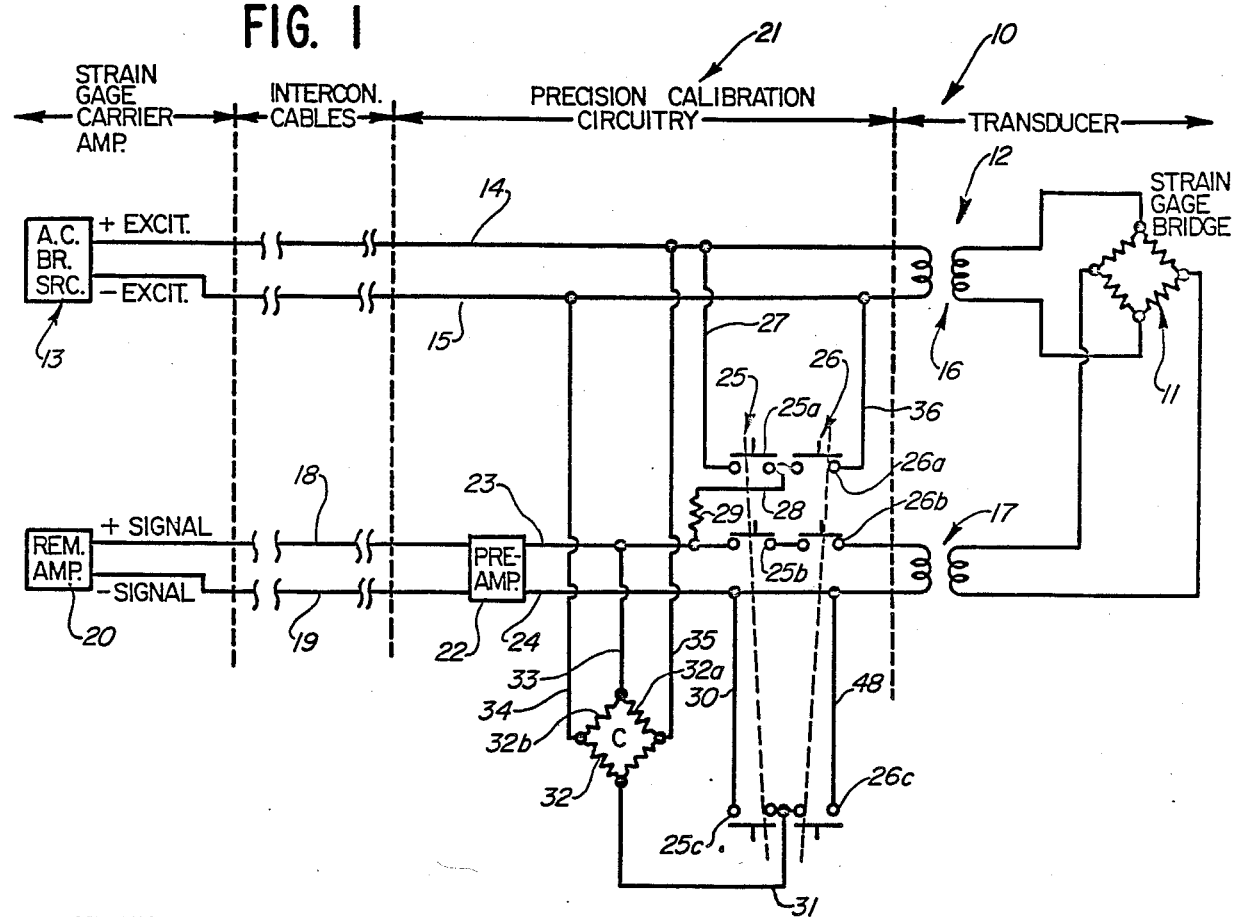
FIG. 1 is a schematic diagram of an apparatus for calibrating a transducer embodying the invention, and illustrating the method of such calibration embodying the invention.

In the illustrative embodiment of the invention as disclosed in the drawing, a circuit generally designated 10 is shown to include a resistive bridge strain gage 11 connected by means of a rotary transformer generally designated 12 to an AC bridge power source generally designated 13 by conductors 14 and 15.

The rotary transformer includes input windings 16 and output windings 17 connected to the strain gage 11 so as to provide an output signal from the strain gage which varies as a function of the strain sensed by the mounting of the strain gage on the strained elements, such as a rotary shaft, etc.

Output winding 17 of the rotary transformer is connected through a pair of cable conductors 18 and 19 to a remote amplifier 20, or other remote output device, as desired.

The present invention comprehends the provision of a precision calibration portion generally designated 21 including a preamplifier 22 connected to the output winding 17 of rotary transformer 12 by conductors 23 and 24. The output of preamplifier 22 is connected through conductors 18 and 19 to the remote amplifier 20.

The calibration circuit portion 21 further includes a first calibration switch generally designated 25 and a second calibration switch generally designated 26. Switches 25 and 26 comprise manually operable switches having three mechanically interlocked switch portions.

Switch 25 includes a first, normally open switch portion 25a, which is connected by a conductor 27 to power source lead 14, and by a conductor 28 to a resistor 29 connected to conductor 23. The second portion 25b of switch 25 comprises a normally closed switch portion which is connected in conductor 23. The third portion 25c of switch 25 comprises a normally open switch portion connected by a conductor 30 to the conductor 24 and by a conductor 31 to a calibration resistive bridge 32. The opposite terminal of the bridge 32 is connected by conductor 33 to the conductor 23. One side terminal of the bridge is connected through a conductor 34 to the conductor 15, and the opposite side terminal of the bridge is connected by a conductor 35 to the conductor 14.

Calibration switch 26 includes a first, normally open portion 26a connected by a conductor 36 to conductor 15 and by conductor 28 through resistor 29 to conductor 23. Switch 26 further includes a normally closed portion 26b connected in series with switch portion 25b in conductor 23 between preamplifier 22 and rotary transformer output winding 17. The calibration switch 26 further includes a normally open, third portion 26c connected by a conductor 48 to conductor 24, and by conductor 31 to calibration bridge 32.

Preamplifier 22 comprises a high input impedance, low output impedance preamplifier. A purely resistive calibration signal is produced at the input to the preamplifier by throwing of the switches 25 and 26 to the calibrating position from the normal operating position of FIG. 1. In the normal operation arrangement of the switches, as seen in FIG. 1, a signal from strain gage bridge 11 is provided through the output rotary transformer section 17 and conductors 23 and 24 through the normally closed portions 25b and 26b to the input of the preamplifier 22. At this time, the normally open switch portions 25a and 26a disconnect the resistor 29 from the circuit and the normally open switch portions 25c and 26c disconnect the resistive bridge 32 from the preamplifier. The low preamplifier output impedance drives the cable conductors 18 and 19 so that the strain gage signal appears at the remote amplifier 20 without cable-induced phase shift or attenuation.

To calibrate the network, the switches 25 and 26 are selectively thrown to the calibration position wherein either switch portion 25a or 26a is closed and the corresponding one of switch portion 25b or 26b is opened and the corresponding switch portion 25c or 26c is closed. This disconnects the strain gage bridge 11 and, instead, the resistive bridge 32 is connected to the input of the preamplifier to provide a purely resistive signal thereto. As the output impedance of the preamplifier 22 is very low, the product of calibration voltage and preamplifier gain appears at the input of the remote amplifier 20 without phase shift. It should be noted that while it is preferred that the preamplifier have a balanced output, it is not mandatory within the broad scope of the invention.

The resistive calibration bridge 32 comprises an accurately balanced Wheatstone bridge in the illustrated embodiment. The bridge is unbalanced by the accurately known resistor 29. It is desirable that the resistors of bridge 32 and resistor 29 be stable precision-type resistors, such as wire wound resistors, having a low temperature coefficient of resistance.

Other resistive calibration networks may be utilized in lieu of the bridge 32, such as resistive star bridges, resistive voltage dividers, etc., within the broad scope of the invention, so as to provide to the preamplifier a purely resistive volt-per-volt network in the calibration circuit portion 21.

The invention further comprehends alternatively providing a purely resistive volts-per-volt calibrator at the input of the preamplifier and to provide the desired precision calibration functioning of circuit portion 21.

Switches 25 and 26 provide bipolar calibration by the reverse connection of the resistor 29 in parallel with the resistive bridge 32. As will be obvious to those skilled in the art, a unipolar circuit may be utilized, as desired.

By means of the selectively operable switches 25 and 26, the calibration circuitry is prevented from shifting the phase of the transducer signal and reversely, the transducer is prevented from shifting the phase of the calibration signal under the two modes of operation of the circuit. Thus, precisely transferable calibration of the transducer having both real and reactive impedance is readily effected by means of the improved circuitry 10.

The invention comprehends the method of calibrating such a transducer having real and reactive impedance by providing a preamplifier having a high impedance input and a low impedance output connected to electrical conductor means, in turn connected to a remote output. The improved method further comprehends alternatively connecting the transducer output to the preamplifier input for preamplifying the transducer output signal and providing through the conductor means an improved low impedance preamplified output signal to the remote output. Alternatively, the circuitry provides a substantially purely resistive calibration signal to the preamplifier input for use in calibrating the transducer when desired.

In the illustrated embodiment, the preamplifier input impedance is preferably greater than 100 megohms and the output impedance is preferably less than 0.1 ohm. The preamplifier gain is typically 1:10. As will be obvious to those skilled in the art, the values of the resistors of the bridge 32 and resistor 29 may be selected for the desired calibration signal in volts-per-volt.

As discussed above, the calibration is effected by unbalancing the balanced bridge 32 a known, repeatable amount selectively switching resistor 29 into parallel relationship with either resistor 32a of the bridge 32 or resistor 32b thereof in carrying out the bipolar calibration.

Figure 2:
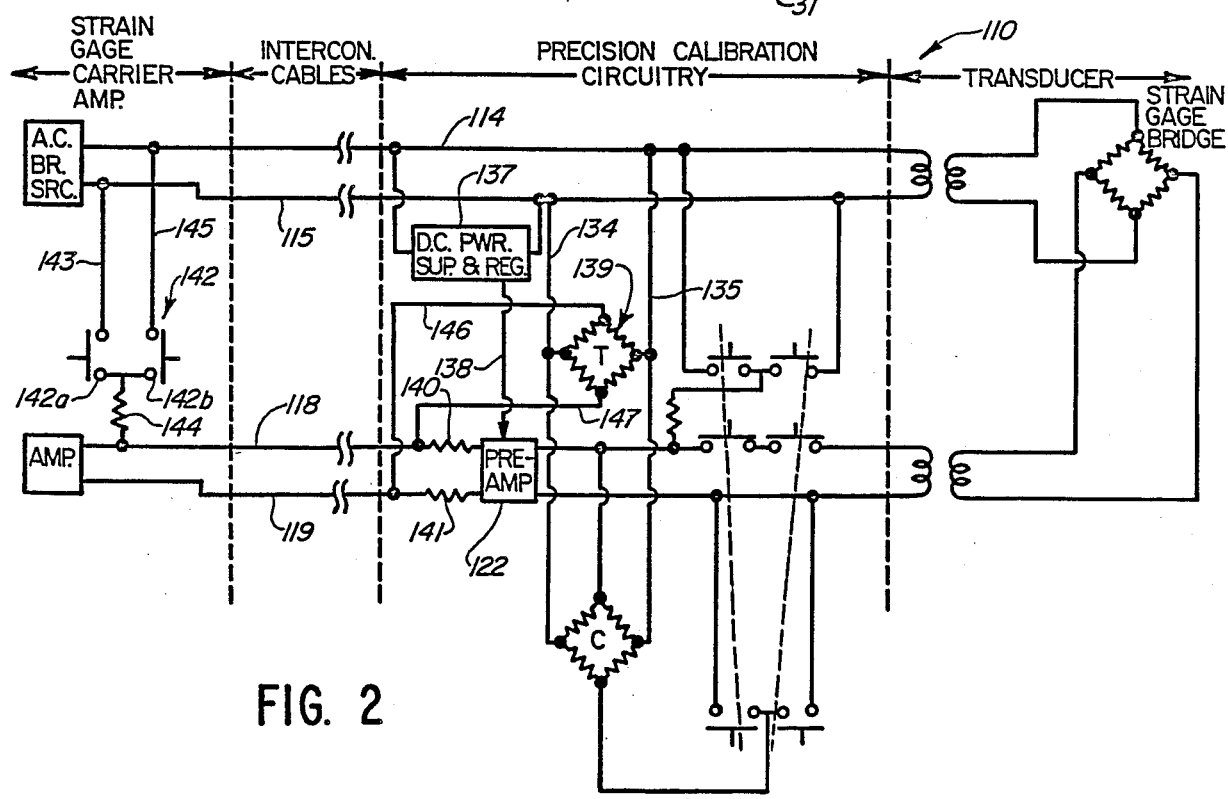
FIG. 2 is a schematic wiring diagram illustrating a modified form of apparatus and method of embodying the invention.

Calibration circuitry 110, as shown in FIG. 2, is similar to circuitry 10 of FIG. 1, but further includes a regulated power supply generally designated 137 for generating DC power for the preamplifier 122. The power supply 137 is connected to the AC power supply leads 114 and 115 and is connected through a cable 138 to the preamplifier 122.

The power supply may comprise a center tapped transformer with diode rectifiers, a full wave bridge rectifier, or other commonly used AC-DC power supply networks, with a conventional voltage regulator.

The invention comprehends that the power supply may be a part of the preamplifier, as shown in FIG. 1, or may comprise a separate power supply which may be driven from the AC excitation pads 114 and 115, as shown in FIG. 2, as desired.

The invention further comprehends, as shown in FIG. 2, the use of an auxiliary calibration network comprised of a conventional shunt calibration circuit, which is commonly provided in conventional strain gage amplifiers. The conventional shunt calibration circuit includes a resistive bridge 139, which, as shown, may comprise a Wheatstone bridge, installed in the output of the preamplifier 122 and isolated therefrom by padder resistors 140 and 141, which prevent the low output impedance of the preamplifier from short-circuiting the output of the shunt calibration circuit. The shunt calibration circuit further includes a bipolar calibration switch having a pair of normally open switch portions 142a and 142b. Switch portion 142a is connected by a conductor 143 to power supply lead 115 and through a resistor 144 to cable conductor 118.

Switch portion 142b is connected through a conductor 145 to power supply lead 114 and to cable conductor 118 through resistor 144.

One terminal of bridge 139 is connected by a conductor 146 to output lead 119 and the opposite terminal is connected by a conductor 147 to output lead 118.

One side terminal of bridge 139 is connected through lead 134 to the input power supply lead 115 and the opposite terminal is connected by lead 135 to the power supply lead 114.

The auxiliary calibration network is used to shunt an arm of the bridge 139 with the resistor 144 so as to generate a local calibration signal. The local calibration signal is related to the precise transfer calibration which is previously performed, as discussed in connection with the circuit 10. As long as the interconnecting cables and the transducer and/or amplifier remain constant, the calibration will remain constant. However, if any of the components are substituted or, for some reason, change in their electrical characteristics, the precise transfer calibration operation may be invoked so as to correct the local calibration.

Circuitry 110 is similar to circuitry 10 and similar components thereof are identified by similar numbers except 100 higher. Except as described above, circuitry 110 functions in a manner similar to circuitry 10.

As will be obvious to those skilled in the art, any number of wires may be employed in interconnecting the elements of the circuit within the broad scope of the invention. As in connection with the switches 25 and 26, the bipolar switch 142 may be substituted for by a unipolar circuit as desired.

Further, the various switches of the calibration circuits of the illustrated embodiment are shown to comprise conventional mechanical switches. As will be obvious to those skilled in the art, suitable electronic switches and the like may be utilized as desired within the scope of the invention.

The foregoing disclosure of inventive concepts is illustrative of the broad inventive concepts comprehended by the invention.

I claim:

1. The method of calibrating a transducer having real and reactive impedance which is excited from an excitation source and which provides an output signal at a transducer output connected by electrical conductor means to a remote load, said method of calibrating comprising in combination the steps of:
   providing a preamplifier having a high impedance input and a low impedance output connected to said electrical conductor means; and
   alternatively (a) connecting said transducer output to said preamplifier input for preamplifying said transducer output signal and providing through said conductor means to said remote load a low impedance preamplified output signal, and (b) providing a substantially purely resistive calibration signal to said preamplifier input for use in calibrating said transducer.

2. The method of calibrating a transducer of claim 1 wherein switching means are provided in electrical association with said transducer and preamplifier, and said step of alternatively connecting said transducer and providing the calibration signal to said preamplifier input comprises as step of selectively operating said switching means.

3. The method of calibrating a transducer of claim 1 wherein said preamplifier is energized from said excitation source.

4. The method of calibrating a transducer of claim 1 wherein a regulated power supply is connected to said excitation source and said preamplifier is energized from said regulated power supply.

5. The method of calibrating a transducer having real and reactive impedance which is excited from an excitation source and which provides an output signal at a transducer output connected by electrical conductor means to a remote load, said method of calibrating comprising the steps of:

provides a preamplifier having a high impedance input and a low impedance output connected to said electrical conductor means;

alternatively (a) connecting said transducer output to said preamplifier input for preamplifying said transducer output signal and providing through said conductor to said remote load a low impedance preamplified output signal, and (b) providing a substantially purely resistive calibration signal to said remote load for use in calibrating said transducer;

providing an auxiliary calibration circuit; and selectively causing said calibration circuit to calibrate said auxiliary calibration circuit.

6. The method of calibrating a transducer of claim 5 wherein said auxiliary calibration circuit is connected to said output of the preamplifier by isolation resistor means.

7. The method of calibrating a transducer of claim 5 wherein said purely resistive calibration signal is provided by a resistive bridge circuit selectively connected to the input of the preamplifier and said auxiliary calibration circuit is driven in parallel with said resistive bridge circuit.

8. The method of calibrating a transducer of claim 5 wherein said purely resistive calibration signal is provided by a resistive bridge circuit selectively connected to the input of the preamplifier and said auxiliary calibration circuit comprises a calibrated resistor selectively connected in parallel with at least a portion of said auxiliary calibration circuit.

9. The method of calibrating a transducer of claim 5 wherein said purely resistive calibration signal is provided by a resistive bridge circuit selectively connected to the input of the preamplifier and said auxiliary calibration circuit comprises a calibrated resistor selectively connected in parallel with at least a portion of said auxiliary calibration circuit and said auxiliary calibration is connected to said output of the preamplifier by isolation resistor means.

10. The method of calibrating a transducer having real and reactive impedance which is excited from an excitation source and which provides an output signal at a transducer output connected by electrical conductor means to a remote load, said method of calibrating comprising in combination the steps of:

providing a preamplifier having a high impedance input and a low impedance output connected to said electrical conductor means;

providing a power supply for powering said preamplifier; and alternatively (a) connecting said transducer output to said preamplifier input for preamplifying said transducer output signal and providing through said conductor means to said remote load a low impedance preamplified output signal, and (b) providing a substantially purely resistive calibration signal to said preamplifier input for use in calibrating said transducer.

11. The method of calibrating a transducer of claim 10 further including the step of providing means for connecting said power supply to said excitation source.

12. The method of calibrating a transducer having real and reactive impedance which is excited from an excitation source and which provides an output signal at a transducer output connected by electrical conductor means to a remote load, said method of calibrating comprising the steps of:

providing a preamplifier having a high impedance input and a low impedance output connected to said electrical conductor means;

providing a power supply for powering said preamplifier; alternatively (a) connecting said transducer output to said preamplifier input for preamplifying said transducer output signal and providing through said conductor means to said remote load a low impedance preamplified output signal, and (b) providing a substantially purely resistive calibration signal to said preamplifier input for use in calibrating said transducer;

providing an auxiliary calibration circuit; and selectively causing said calibration circuit to calibrate said auxiliary calibration circuit.

13. The method of calibrating a transducer having real and reactive impedance which is excited from an excitation source and which provides an output signal at a transducer output connected by electrical conductor means to a remote load, said method of calibrating comprising the steps of:

providing a preamplifier having a high impedance input and a low impedance output connected to said electrical conductor means;

providing a power supply for powering said preamplifier;

alternatively (a) connecting said transducer output to said preamplifier input for preamplifying said transducer output signal and providing through said conductor means to said remote load a low impedance preamplified output signal, and (b) providing a substantially purely resistive calibration signal to said preamplifier input for use in calibrating said transducer;

providing means for removably connecting said power supply to said excitation source;

providing an auxiliary calibration circuit; and selectively causing said calibration circuit to calibrate said auxiliary calibration circuit.

14. The method of calibrating a transducer of claim 13 wherein said step of selectively causing said calibration circuit to calibrate said auxiliary calibration circuit is effected following provision of the substantially purely resistive calibration signal to said preamplifier input.

15. Apparatus for calibrating a transducer having real and reactive impedance which is excited from an excitation source and which provides an output signal at a transducer output connected by electrical conductor means to a remote load, said apparatus comprising:

a preamplifier having a high impedance input and a low impedance output connected to said electrical conductor means; and means for alternatively (a) connecting said transducer output to said preamplifier input for preamplifying said transducer output signal and providing through said conductor means to said remote load a low impedance preamplified output signal, and (b) providing a substantially purely resistive calibration signal to said preamplifier input for use in calibrating said transducer.

16. The apparatus for calibrating a transducer of claim 15 further including switching means in electrical association with said transducer and preamplifier, and means for selectively operating said switching means.

17. The apparatus for calibrating a transducer of claim 15 including means electrically connecting said preamplifier to said excitation source to be energized therefrom.

18. The apparatus for calibrating a transducer of claim 15 including regulated power supply means adapted to be connected to said excitation source for energizing said preamplifier.

19. Apparatus for calibrating a transducer having real and reactive impedance which is excited from an excitation source and which provides an output signal at a transducer output connected by electrical conductor means to a remote load, said apparatus comprising:

a preamplifier having a high impedance input and a low impedance output connected to said electrical conductor means;

means for alternatively (a) connecting said transducer output to said preamplifier input for preamplifying said transducer output signal and providing through said conductor means to said remote load a low impedance preamplified output signal, and (b) providing a substantially purely resistive calibration signal to said preamplifier input for use in calibrating said transducer;

an auxillary calibration circuit; and means for selectively causing said calibration circuit to calibrate said auxiliary calibration circuit.

* * * * *